(12) United States Patent
Yang et al.

(10) Patent No.: US 6,479,402 B1
(45) Date of Patent: Nov. 12, 2002

(54) METHOD TO IMPROVE ADHESION OF MOLDING COMPOUND BY PROVIDING AN OXYGEN RICH FILM OVER THE TOP SURFACE OF A PASSIVATION LAYER

(75) Inventors: Chie-Ming Yang, Hsin-Chu (TW); Hui-Chi Lin, Hsin Chu (TW); Jun-Yang Lai, Ping-Tung (TW); Jiann-Liang Liou, Hsinchu (TW); Cheng-Yeh Shih, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/999,482

(22) Filed: Dec. 3, 2001

(51) Int. Cl.⁷ .................. H01L 21/31; H01L 21/469
(52) U.S. Cl. .................. 438/763; 438/771; 438/780; 438/792
(58) Field of Search .................. 438/763, 771, 438/770, 791, 792, 780

(56) References Cited

U.S. PATENT DOCUMENTS

| | | | |
|---|---|---|---|
| 5,595,934 A | 1/1997 | Kim | 437/180 |
| 5,883,001 A | 3/1999 | Jin et al. | 438/624 |
| 6,046,071 A | 4/2000 | Sawai et al. | 438/106 |
| 6,096,649 A | 8/2000 | Jang | 438/687 |
| 6,197,701 B1 * | 3/2001 | Shue et al. | 438/763 |
| 6,265,294 B1 * | 7/2001 | Park et al. | 438/553 |

* cited by examiner

*Primary Examiner*—Alexander Ghyka
(74) *Attorney, Agent, or Firm*—George O. Saile; Stephen B. Ackerman

(57) ABSTRACT

A new method is provided for treating the surface of a layer of passivation where this layer of passivation comprises silicon dioxide or silicon nitride. An oxygen rich layer is created over the surface of the layer of passivation. Under the first embodiment of the invention a layer of silicon oxide is deposited over the surface of a substrate, a layer of plasma enhanced silicon nitride is deposited over the surface of the layer of silicon oxide, and a layer of oxynitride is deposited over the surface of the layer of plasma enhanced silicon nitride. Under the second embodiment of the invention a layer of silicon oxide is deposited over the surface of a substrate, a layer of silicon nitride is deposited over the surface of layer of silicon oxide. The surface of the layer of silicon nitride is oxidized by $N_2O$ or $O_2$ plasma treatment.

25 Claims, 1 Drawing Sheet

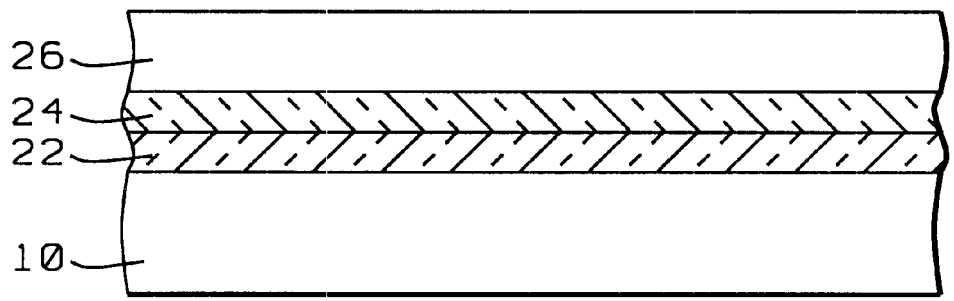
*FIG. 1 - Prior Art*
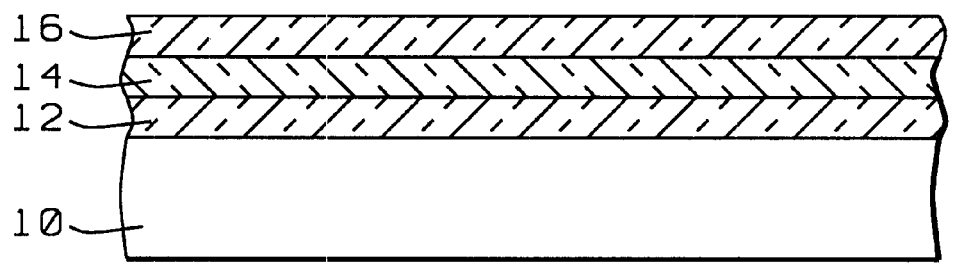
*FIG. 2*
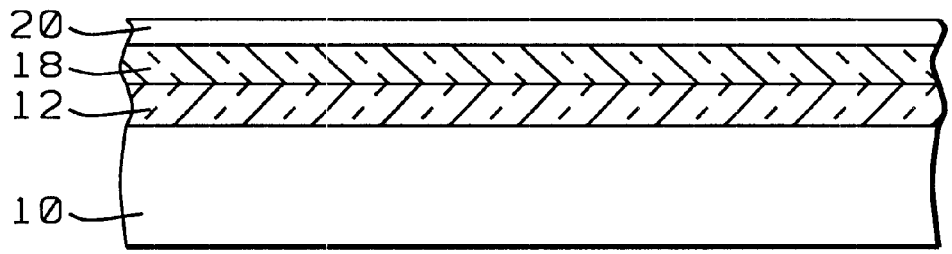
*FIG. 3*

METHOD TO IMPROVE ADHESION OF MOLDING COMPOUND BY PROVIDING AN OXYGEN RICH FILM OVER THE TOP SURFACE OF A PASSIVATION LAYER

BACKGROUND OF THE INVENTION (1) Field of the Invention

The invention relates to the fabrication of integrated circuit devices, and more particularly, to a method of improving the adhesion of molding compound over the surface of a passivation layer by first creating an oxygen rich layer over the surface of the layer of passivation.

(2) Description of the Prior Art

The creation of semiconductor devices entails the creation of interactive circuit elements in or on the surface of a substrate. After these circuit elements have been created, the semiconductor die is further processed which in many cases implies,the further mounting of a singulated die into a semiconductor package. Before the final processing of the semiconductor device takes place, the device needs to be protected against damage that can be inflicted on the devices by chemical reaction with surrounding elements or by mechanical damage such as scratching of the surface of the device. For these reasons a layer of passivation material is typically deposited over the surface of the completed device. The passivation layer that is deposited over the surface of the device coats the device with a protective layer. For layers of passivation to meet the objective of protecting the surface of the underlying device, such layers must be resistant to thermal and mechanical stress and must further form a barrier against chemical reaction of the surface of the device with surrounding elements.

After a semiconductor device has been created, measures must be taken to interconnect the device to surrounding circuitry. For this purpose, bond pads are created on the surface of the device by depositing a layer of metal, typically aluminum, over the surface of the device. The layer of metal is patterned and etched creating bond pads that can be interconnected with contact points provided on the surface of the semiconductor device. After the bond pads have been created, the surface of the device is typically covered with a layer of passivation wherein openings are provided for the establishment of electrical contacts with the created bond pads. The thus completed device is next packaged, the main objectives of the device packaging are to protect the device against external influences (dust, heat, moisture, chemicals, electrically charged particles) and mechanical influences (scratching, breakage of the device, heat stress). The device package further serves as the main electrical interconnect interface between the device and surrounding electrical components.

The essential advantages that are gained by packaging the semiconductor device have already been highlighted. One of the disadvantages that is incurred as a result of the packaging of the device is due to the fact that aluminum is prone to corrode when exposed to moisture. Moisture penetrates the plastic material that is typically used for the device package and will cause corrosion in sensitive interfaces of the device and the package such as variations in density of the plastic material (cracks) or in any opening that may exist between the mounted die and the lead frame on which the die is mounted. Frequently attacked by corrosion are also points of interconnect of the die, such as the contact point where a bond wire is connected to a bond pad.

It is clear that in packaging semiconductor devices all interfaces that are established within the package must be solid and firm interfaces without the occurrence of any openings or surface irregularities that lend themselves to the accumulation of impurities and moisture with subsequent results of corrosion, high resistivity contact points, problems of reliability and the like. In addition, the interface between the layer of passivation and the overlying plastic material that encases the device must be mechanically strong so that the bond that is formed between the layer of passivation and the overlying plastic material (epoxy) is stress resistant. The invention provides a method that increases the adhesion strength between the surface of the layer of passivation that has been deposited over the die and the molding compound. The invention further eliminates problems of surface delamination of the interface between the die surface and the overlying molding compound.

U.S. Pat. No. 5,595,934 (Kim) shows forming an oxide protective film on a bond pad.

U.S. Pat. No. 6,096,649 (Jang) reveals a method to roughen the surface to improve adhesion.

U.S. Pat. No. 6,046,071 (Sawai et al. al.) and U.S. Pat. No. 5,883,001 (Jin et al.) are related patents.

SUMMARY OF THE INVENTION

A principle objective of the invention is to increase the adhesion strength between a layer of passivation that has been deposited over the surface of a semiconductor die and an overlying molding compound.

Another objective of the invention is to provide a post nitride oxide of oxide treatment to the surface of a layer of passivation in order to increase adhesion strength between the layer of passivation and an overlying layer of epoxy.

Yet another objective of the invention is to eliminate delamination in the interface between a layer of passivation and an overlying layer of epoxy.

In accordance with the objectives of the invention a new method is provided for treating the surface of a layer of passivation where this layer of passivation comprises silicon dioxide or silicon nitride. An oxygen rich layer is created over the surface of the layer of passivation.

Under the first embodiment of the invention a layer of silicon oxide is deposited over the surface of a substrate, a layer of plasma enhanced silicon nitride is deposited over the surface of the layer of silicon oxide, and a layer of oxynitride is deposited over the surface of the layer of plasma enhanced silicon nitride, Under the second embodiment of the invention a layer of silicon oxide is deposited over the surface of a substrate, a layer of silicon nitride is deposited over the surface of layer of silicon oxide. The surface of the layer of silicon nitride is oxidized.

BRIEF DESCRIPTION OF THE DRAWINGS

FIG. 1 shows a cross section of conventional art processing in creating a layer of passivation over the surface of a semiconductor substrate.

FIG. 2 addresses the first embodiment of the invention with the deposition of a layer of silicon oxide over the surface of a substrate, a layer of plasma enhanced silicon nitride is deposited over the surface of the layer of silicon oxide and a layer of oxynitride is deposited over the surface of the layer of plasma enhanced silicon nitride.

FIG. 3 addresses the second embodiment of the invention with the deposition of a layer of silicon oxide over the surface of a substrate, a layer of silicon nitride is deposited over the surface of layer of silicon oxide, a layer of thermal silicon oxide bonds is created on the surface of the layer of silicon nitride.

DESCRIPTION OF THE PREFERRED EMBODIMENTS

As examples of passivation materials can be cited silicon dioxide, silicon nitride, a conventional oxide/nitride/oxide or $Si_xN_y$ passivation layer comprising a dielectric material such as a silicate (such as silicon dioxide, tetraethylorthosilicate based oxides, etc.), phosphosilicate (phosphate-silicate-glass), borophosphosilicate glass (borophosphate-silicate glass), borosilicate-glass, oxide-nitride-oxide glass, tantalum pentoxide, plasma etched silicon nitride, titanium oxide, silicon oxynitrides, etc.

The preferred materials to be used by the invention for a layer of passivation are silicon dioxide and silicon nitride, which does however not imply that the invention is limited to using these materials for the layer of passivation. It is well known in the art that the surface of such a layer of passivation has relatively poor adhesion to an epoxy compound, which is typically used over the surface of the layer of passivation during packaging of a semiconductor device. A layer of passivation is deposited over the surface of a semiconductor device for reasons of protecting and shielding the semiconductor device. Silicon nitride and silicon dioxide are used as a passivation layer due to their ability to provide an impermeable barrier to moisture and to mobile impurities (e.g. sodium ions). Silicon nitride and silicon dioxide also form a tough coating that protects an underlying integrated circuit against mechanical damage.

Qualification tests to which the completed package, of which the layer of passivation and a thereover deposited epoxy compound are part, include stress tests that are humidity and temperature based tests of thermal cycling. These thermal cycling tests are representative of for instance solder reflow and baking of the package.

FIG. 1 shows a cross section of conventional art processing in creating a layer of passivation over the surface of a semiconductor substrate, as follows:

10, the surface of a semiconductor substrates typically the surface of a single crystalline silicon substrate 22, a layer of silicon oxide that has been deposited over the surface of the substrate 10

24, a layer of silicon nitride that has been deposited over the surface of the layer 22 of silicon oxide, and 26, molding compound such as an epoxy based compound that has been deposited over the surface of the layer 24 of silicon nitride.

The problem that is encountered with the prior art arrangement that is shown in cross section in FIG. 1 is that the adhesion between the upper layer 24 (of silicon nitride) and the overlying layer 26 of molding compound is not strong, resulting in interface separation and delamination in the interface between these two layers. An improved method must therefore be provided that assures improved adhesion between a layer of passivation and overlying molding compound.

The preferred method of the invention of creating a layer of passivation layer is next highlighted, using FIGS. 2 and 3.

FIG. 2 addresses the first embodiment of the invention and shows a cross section a layers of semiconductor material that have been deposited over the surface of a semiconductor substrate, as follows:

10, the surface of a semiconductor substrate, typically the surface of a single crystalline silicon substrate 12, a layer of silicon oxide that has been deposited over the surface of the substrate 10

14, a layer of plasma enhanced silicon nitride that has been deposited over the surface of the layer 12 of silicon oxide, and 16, a layer of oxynitride that has been deposited over the surface of the layer 14 of plasma enhanced silicon nitride.

Layer 12 of silicon oxide ($SiO_x$) can be formed using monosilane ($SiH_4$) and nitrous oxide ($N_2O$) as a source material, deposited using LPCVD or PECVD procedures, at a temperature between about 300 and 800 degrees C. Typical deposition thickness for a layer of silicon oxide that forms part of a stack of passivation layers is between about 1,000 and 3,000 Angstrom, more preferred is a thickness of about 2,000 Angstrom.

Layer 14 of plasma enhanced silicon nitride ($PESiN_x$) is formed using a one step PECVD procedure that simultaneously employs gasses containing silicon and nitrogen, such as using $SiH_4$ or $SiCl_2H_2$ and $N_2$ and $NH_3$. Typical deposition thickness for a layer of silicon nitride that forms part of a stack of passivation layers is between about 1,000 and 10,000 Angstrom, more preferred is a thickness of about 7,000 Angstrom.

Layer 16 of silicon oxynitride ($SiO_xN_y$) is preferably deposited to a thickness of between about 1,000 and 3,000 Angstrom, and more preferably to a thickness of about 2,000 Angstrom. The deposition of the layer 16 of oxynitride uses $SiH_4+N_2O+N_2$ or $SiH_4+N_2O+He$ or $SiH_4+N_2O+Ar$ as a source, with N2 or He or Ar as dilute gas, using the CVD process at a temperature between about 300 and 400 degrees C. and a pressure between about 0.8 and 6 Torr.

From the above indicated processing conditions that are used for the creation of layers 14 and 16 it is clear that these layers can be sequentially created, using the same processing chamber, by adjusting the gas flow that is required for the creation of a layer of plasma enhanced silicon nitride (layer 14) to creating a layer of silicon oxynitride (layer 16).

The top layer of the series of layers that is shown in cross section in FIG. 2, that is layer 16 of silicon oxynitride, is, for the stack of passivation layers 12, 14 and 16, the upper layer of the stack and is therefore the layer over which any other substances will be deposited when packaging the semiconductor device. These substances substantially include an epoxy based filler material that forms the essence of the package of the semiconductor device. The top layer 16 of silicon oxynitride provides significantly improved adhesion with the overlying epoxy material, thus increasing stress resistance of the package and reducing problems of delamination in the interface between the layer of passivation and the epoxy material.

FIG. 3 addresses the second embodiment of the invention, the cross section that is shown in FIG. 3 comprises the following elements:

10, the surface of a semiconductor substrate, typically the surface of a single crystalline silicon substrate 12, a layer of silicon oxide that has been deposited over the surface of the substrate 10

18, a layer of silicon nitride that has been deposited over the surface of layer 12 of silicon oxide.

Layers 12 and 18 form the stack of passivation layers that has been created over the surface of substrate 10.

Layer 12 of silicon oxide ($SiO_x$) can be formed using monosilane ($SiH_4$) and nitrous oxide ($N_2O$) as a source material, deposited using LPCVD or PECVD procedures, at a temperature between about 300 and 800 degrees C. Typical deposition thickness for a layer of silicon oxide that forms part of a stack of passivation layers is between about 1,000 and 3,000 Angstrom, more preferred is a thickness of about 2,000 Angstrom.

The layer 18 of silicon nitride can be deposited using LPCVB or PECVD procedures at a pressure between about 300 mTorr and 5 Torr, at a temperature between about 300 and 800 degrees C., to a thickness between about 1,000 and 10,000 Angstrom and more preferably to a thickness of about 7,000 Angstrom, using $NH_3$ and $SiH_4$.

The surface of the layer of silicon nitride is next exposed to an oxidizing plasma environment by exposing the surface to an environment containing either a $N_2O$ or an $O_2$ plasma, at a temperature of between about 300 and 400 degrees C., for a time period between about 30 and 120 seconds. In-situ $N_2O$ or $O_2$ plasma treating the surface of a layer 18 of silicon nitride increases thermal silicon oxide bonds, layer 20, FIG. 3, over the surface of the layer 18 of silicon nitride, which enhance the adhesive strength between the layer of passivation and the overlying molding compound.

Experimental data have confirmed that the objectives of the invention have been achieved by the two embodiments of the invention, the results that are obtained by the invention can be summarized as follows:

1. in-situ deposition of a layer of silicon oxynitride over the surface of a layer of plasma enhanced silicon nitride creates additional chemical bonds overlying the layer of plasma enhanced silicon nitride which form coupling agents between the layer of passivation and the overlying molding compound. These additional chemical bonds enhance the adhesive strength between the layer of passivation and the overlying molding compound.

2. in-situ $N_2O$ of $O_2$ plasma treating the surface of a layer of silicon nitride increases thermal silicon oxide bonds over the surface of the layer of silicon nitride, which enhance the adhesive strength between the layer of passivation and the overlying molding compound.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for the creation of an oxygen rich surface for a layer of passivation, thereby improving adhesion between the surface of the passivation layer and an overlying molding compound, comprising the steps of:

providing a semiconductor substrate, said substrate having been provided with at least one semiconductor device in or on the surface thereof;

depositing a layer of silicon oxide over the surface of said substrate;

depositing a layer of plasma enhanced silicon nitride over the surface of said layer of silicon oxide;

depositing a layer of silicon oxynitride over the surface of said layer of plasma enhanced silicon nitride; and depositing a molding compound over the surface of said layer of silicon oxynitride.

2. The method of claim 1, said depositing a layer of silicon oxide over the surface of said substrate comprises using monosilane ($SiH_4$) and nitrous oxide ($N_2O$) as a source material, deposited using LPCVD or PECVD procedures, at a temperature between about 300 and 800 degrees C., preferred deposition thickness for a layer of silicon oxide being between about 1,000 and 3,000 Angstrom.

3. The method of claim 1, said depositing a layer of silicon nitride over the surface of said layer of silicon oxide comprises using a one step PECVD procedure that simultaneously employs gasses containing silicon and nitrogen, said gasses being selected from the group consisting of $SiH_4$ or $SiCl_2H_2$ and $N_2$ or $NH_3$, deposited to a thickness between about 1,000 and 10,000 Angstrom.

4. The method of claim 1, said depositing a layer of silicon oxynitride over the surface of said layer of silicon nitride ($SiO_xN_y$) comprising using $SiH_4+N_2O+N_2$ or $SiH_4+N_2O+He$ or $SiH_4+N_2O+Ar$ as a source, with N2 or He or Ar as dilute gas, using the CVD process at a temperature between about 300 and 400 degrees C. and a pressure between about 0.8 and 4 Torr. preferably deposited to a thickness of between about 1,000 and 3,000 Angstrom.

5. A method for the creation of an oxygen rich surface for a layer of passivation, thereby improving adhesion between the surface of the passivation layer and an overlying molding compound, comprising the steps of:

providing a semiconductor substrate, said substrate having been provided with at least one semiconductor device in or on the surface thereof;

depositing a layer of silicon oxide over the surface of said substrate;

depositing a layer of silicon nitride over the surface of said layer of silicon oxide;

exposing the surface of said layer of silicon nitride to an oxidizing plasma environment; and depositing a molding compound over the exposed surface of said layer of silicon nitride.

6. The method of claim 5, wherein said depositing a layer of silicon oxide over the surface of said substrate comprises using monosilane ($SiH_4$) and nitrous oxide ($N_2O$) as a source material, deposited using LPCVD or PECVD procedures, at a temperature between about 300 and 800 degrees C., preferred deposition thickness for a layer of silicon oxide being between about 1,000 and 3,000 Angstrom.

7. The method of claim 5, wherein said depositing a layer of silicon nitride over the surface of said layer of silicon oxide comprises using LPCVD or PECVD procedures at a pressure between about 300 mTorr and 5 Torr, at a temperature between about 300 and 800 degrees C., to a thickness between about 1,000 and 10,000 Angstrom, using $NH_3$ and $SiH_4$.

8. The method of claim 5, wherein said exposing the surface of said layer of silicon nitride to an oxidizing plasma environment comprises exposing the surface of said layer of silicon nitride to an oxidation environment containing either a $N_2O$ or an $O_2$ plasma, in a plasma environment at a temperature in the range of about 300 and 400 degrees C., for a time period within the range between about 30 and 120 seconds.

9. The method of claim 1, said molding compound comprising an epoxy based filler material.

10. The method of claim 5, said molding compound comprising an epoxy based filler material.

11. A method of providing a layer of passivation of increased adhesive strength between the layer of passivation and an overlying layer of molding compound, comprising the steps of:

providing a semiconductor substrate, said substrate having been provided with at least one semiconductor device in or on the surface thereof;

depositing a layer of layer of passivation over the surface of said substrate, said layer of passivation comprising:
(i) a first layer of silicon oxide deposited over the surface of said substrate; and
(ii) a second layer of silicon nitride over the surface of said first layer of silicon oxide; and
creating silicon oxide bonds over the surface of said second layer of silicon nitride, thereby enhancing adhesive strength between the layer of passivation and overlying molding compound.

12. The method of claim 11, said creating silicon oxide bonds over the surface of said second layer of silicon nitride comprising exposing the surface of said second layer of silicon nitride to an oxidizing plasma environment.

13. The method of claim 11, said creating silicon oxide bonds over the surface of said second layer of silicon nitride comprising exposing the surface of said second layer of silicon nitride to a post nitride oxide or oxide treatment.

14. The method of claim 11, additionally depositing a molding compound over said silicon oxide bonds created over the surface of said second layer of silicon nitride.

15. The method of claim 11, wherein said depositing a first layer of silicon oxide over the surface of said substrate comprises using monosilane ($SiH_4$) and nitrous oxide ($N_2O$) as a source material, deposited using LPCVD or PECVD procedures, at a temperature between about 300 and 800 degrees C., preferred deposition thickness for a layer of silicon oxide being between about 1,000 and 3,000 Angstrom.

16. The method of claim 11, wherein said depositing a second layer of silicon nitride over the surface of said layer of silicon oxide comprises using LPCVD or PECVD procedures at a pressure between about 300 mTorr and 5 Torr, at a temperature between about 300 and 800 degrees C., to a thickness between about 1,000 and 10,000 Angstrom.

17. The method of claim 12, wherein said exposing the surface of said second layer of silicon nitride to an oxidizing plasma environment comprises exposing the surface of said second layer of silicon nitride to an oxidation environment containing either a $N_2O$ or an $O_2$ plasma, in a plasma environment at a temperature in the range of about 300 and 400 degrees C., for a time period within the range between about 30 and 120 seconds.

18. The method of claim 13, said molding compound comprising an epoxy based filler material.

19. A method of providing a layer of passivation of increased adhesive strength between the layer of passivation and an overlying layer of molding compound, comprising the steps of:

providing a semiconductor substrate, said substrate having been provided with at least one semiconductor device in or on the surface thereof;
depositing a layer of layer of passivation over the surface of said substrate, said layer of passivation comprising:
(i) a first layer of silicon oxide deposited over the surface of said substrate; and
(ii) a second layer of silicon nitride over the surface of said first layer of silicon oxide;
creating silicon oxide bonds over the surface of said second layer of silicon nitride, thereby enhancing adhesive strength between the layer of passivation and overlying molding compound; and
depositing a molding compound over the silicon oxide bonds created over the surface of said second layer of silicon nitride.

20. The method of claim 19, said creating silicon oxide bonds over the surface of said second layer of silicon nitride comprising exposing the surface of said second layer of silicon nitride to an oxidizing plasma environment.

21. The method of claim 19, said creating silicon oxide bonds over the surface of said second layer of silicon nitride comprising exposing the surface of said second layer of silicon nitride to a post nitride oxide or oxide treatment.

22. The method of claim 19, wherein said depositing a first layer of silicon oxide over the surface of said substrate comprises using monosilane ($SiH_4$) and nitrous oxide ($N_2O$) as a source material, deposited using LPCVD or PECVD procedures, at a temperature between about 300 and 800 degrees C., preferred deposition thickness for a layer of silicon oxide being between about 1,000 and 3,000 Angstrom.

23. The method of claim 19, wherein said depositing a second layer of silicon nitride over the surface of said layer of silicon oxide comprises using LPCVD or PECVD procedures at a pressure between about 300 mTorr and 5 Torr, at a temperature between about 300 and 800 degrees C., to a thickness between about 1,000 and 10,000 Angstrom.

24. The method of claim 20, wherein said exposing the surface of said second layer of silicon nitride to an oxidizing plasma environment comprises exposing the surface of said second layer of silicon nitride to an oxidation environment containing either a $N_2O$ or an $O_2$ plasma, in a plasma environment at a temperature in the range of about 300 and 400 degrees C., for a time period within the range between about 30 and 120 seconds.

25. The method of claim 19, said molding compound comprising an epoxy based filler material.

\* \* \* \* \*